US005909152A

United States Patent [19]
Li et al.

[11] Patent Number: 5,909,152
[45] Date of Patent: Jun. 1, 1999

[54] LOW POWER CMOS CRYSTAL OSCILLATOR CIRCUIT

[75] Inventors: Jia Li, Dallas; Ching-Yuh Tsay, Plano, both of Tex.

[73] Assignee: Texas Instruments Incorporated, Dallas, Tex.

[21] Appl. No.: 09/031,636

[22] Filed: Feb. 27, 1998

Related U.S. Application Data

[60] Provisional application No. 60/039,653, Feb. 28, 1997.

[51] Int. Cl.⁶ .................... H03B 5/06; H03B 5/36
[52] U.S. Cl. .................... 331/116 FE; 331/158; 331/173
[58] Field of Search .................... 331/116 R, 116 FE, 331/108 C, 158, 173, 183, 185, 186

[56] References Cited

U.S. PATENT DOCUMENTS

| | | | |
|---|---|---|---|
| 3,753,154 | 8/1973 | Moreau et al. | 331/116 R |
| 3,979,698 | 9/1976 | Gollinger | 331/116 R |
| 4,095,195 | 6/1978 | Saito | 331/116 FE |
| 4,218,661 | 8/1980 | Imamura | 331/116 FE |
| 4,328,571 | 5/1982 | Noble | 368/87 |
| 4,346,350 | 8/1982 | Morokawa | 331/116 FE |
| 4,360,789 | 11/1982 | Lewyn et al. | 331/109 |
| 4,387,349 | 6/1983 | Rapp | 331/116 FE |
| 4,591,807 | 5/1986 | Davis | 331/116 R |
| 4,613,829 | 9/1986 | Ott | 331/59 |
| 4,704,587 | 11/1987 | Ouyang et al. | 331/116 FE |
| 4,870,383 | 9/1989 | Nordholt | 331/116 R |
| 4,896,122 | 1/1990 | Tahernia et al. | 331/158 |
| 4,956,618 | 9/1990 | Ulmer | 331/116 FE |
| 5,162,757 | 11/1992 | Williams et al. | 331/75 |
| 5,208,558 | 5/1993 | Shigehara et al. | 331/116 FE |
| 5,331,296 | 7/1994 | Davis | 331/158 |
| 5,450,042 | 9/1995 | Good et al. | 331/117 FE |
| 5,486,795 | 1/1996 | Spence et al. | 331/116 FE |
| 5,528,201 | 6/1996 | Davis | 331/116 FE |
| 5,546,055 | 8/1996 | Klughart | 331/116 FE |

FOREIGN PATENT DOCUMENTS 404165704 6/1992 Japan .................... 331/158

OTHER PUBLICATIONS

Tsuzuki et al, "Fast Start-Up Crystal Oscillator Circuits," 1995 IEEE International Frequency Control Symposium, May 31,–Jun. 2, 1995, pp. 565–568.

Kuboku et al., "Design Considerations for Low-Voltage Crystal Oscillator Circuit in a 1.8-V Single Chip Microprocessor," IEICE Trans. Electron., vol. E76–C, No. 5, May 1993, pp. 701–707.

Ohtaka et al., "A Study on Start-Up Characteristics of Crystal Oscillators Using Resonators with Nonlinear Drive Level Characteristics," IEICE Trans. Fundamentals, vol. E78–A, No. 11, Nov. 1995, pp. 1528–1530.

Thomas B. Mills, "CMOS Gate Oscillator Design," Proceedings fo the 41st Annual Frequency Symposium 1987, pp. 460–464.

Nordholt et al., "'Single–Pin' Integrated Crystal Oscillators," IEEE Transactions on Circuit and Systems, vol. 37, No. 2, Feb. 1990, pp. 175–182.

Tsuzuki et al., "Formulation of Nonlinear Negative Resistance for Calculation of Start–Up Characteristics of Crystal Oscillators," 1996 IEEE International Frequency Control Symposium, pp. 710–713.

*Primary Examiner*—David Mis
*Attorney, Agent, or Firm*—W. James Brady, III; Richard L. Donaldson

[57] ABSTRACT

A crystal-stabilized integrated-circuit oscillator which uses a filtered analog coupling to automatically disable the bias current to an auxiliary gain after startup. Positive feedback is used to ensure that the switchover is completed once it starts. Thus the device sizes and biases of the primary gain stage can be selected for very low-power operation, while assuring that the oscillator will always start-up whenever poser is valid.

11 Claims, 3 Drawing Sheets

LOW POWER CMOS CRYSTAL OSCILLATOR CIRCUIT

This application claims priority under 35 USC §119(e)(1) of provisional application Ser. No. 60/039,653 filed Feb. 28, 1997.

BACKGROUND AND SUMMARY OF THE INVENTION

The present invention relates to crystal-stabilized integrated circuit oscillators.

Crystal-controlled oscillators use the high Q of an electromechanical resonator (a quartz crystal) to stabilize an integrated oscillating circuit at a desired frequency. Such circuits can achieve a frequency stability in the parts-per-million range, and there is no other practical way to achieve such a constant frequency reference in an integrated circuit. Crystal-controlled oscillators are therefore extremely important, and likely to remain so.

Crystal-controlled oscillators pose some difficulties in design, and one of these is start-up. The impedance of the crystal is typically much higher at zero current condition (which are necessarily present at start-up), so in come implementations the initial loop gain is not enough to start the oscillator. A variety of startup circuits have therefore been proposed; see e.g. B. Parzen, DESIGN OF CRYSTAL AND OTHER HARMONIC OSCILLATORS (1983), at page 415: Unkrich et al., "Conditions for Start-Up in Crystal Oscillators," 17 *IEEE J. Solid-state Circuits* 87 (1982).

Other difficulties are present in the specific context of low-power CMOS oscillator implementations. Many portable applications are designed for low operating voltage and low power consumption, but also require the frequency stability of crystal oscillator. To reduce power consumption, such low-power CMOS oscillator circuits are typically operated in the weak inversion regime (where gate voltages are only slightly greater than the threshold voltage). However, in the weak inversion regime the gain tends to be lower, and thus start-up is a particularly critical problem. See e.g. U.S. Pat. No. 5,546,055, which is hereby incorporated by reference.

Many circuits have been proposed to permit the loop gain to be increased at startup. The input to make this change is conventionally supplied by some external circuit. A prior art example of this is shown in FIG. 4 (taken from U.S. Pat. No. 4,896,122), where the "programmable activity detector" 402 is digital circuit. Until this digital circuit detects the presence of logic transitions on the output FO of final amplifier 322, it generates a logic signal BWC. When this signal is active (and external control signal OSON is active), auxiliary gain stage 218 is turned on, and operates in parallel with the primary gain stage 202. However, the use of a digital circuit to make this determination provides only imperfect matching to the variations which may affect the characteristics of the analog oscillator.

Innovation Structures and Methods

The present application discloses a crystal oscillator which uses a filtered analog coupling to automatically disable the bias current to an auxiliary gain stage after startup. Preferably this analog coupling includes some positive feedback, to ensure that the switchover is completed once it starts. Thus the device sizes and biases of the primary gain stage can be selected for very low-power operation, while assuring that the oscillator will always start-up whenever power is valid.

Advantages of the disclosed methods and structures include:

reliable oscillator start-up:
robust design which is tolerant of minor variations: and
minimum-power operation.

BRIEF DESCRIPTION OF THE DRAWINGS

The disclosed invention will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous used of the innovative teachings herein. In general, statements made in specification of the present application do not necessarily delimit any of the various claimed invention. Moreover, some statements may apply to come inventive features but not to others.

First Sample Embodiment

Figure 1:
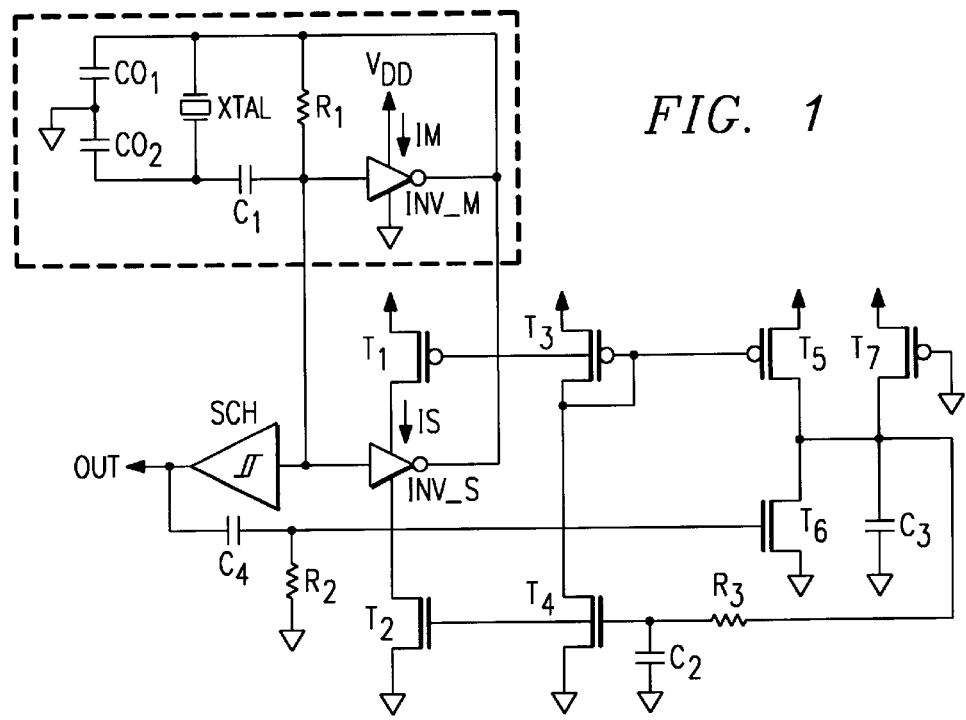
FIG. 1 shows a sample crystal oscillator embodiment.

FIG. 1 shows a sample crystal oscillator embodiment. The crystal XTAL is connected in the feedback path of primary gain stage inv_m. Capacitors CO1 and CO2 provides a virtual AC ground for the crystal, and help to prevent parasitic oscillation modes. Resistor R1 is a high impedance which provides self-biasing for the oscillator. Capacitor C1 prevents leakage currents, which can easily appear at the off-chip connections X1 and X2, from affecting the oscillator's operating point.

Auxiliary gain stage inv_s is connected in parallel with the main gain stage. Note, however, that the auxiliary gain stage has both supply connections controlled: current sourced from VDD is controlled by transistor T1, and current sinked to ground is controlled by transistor T2. Primary gain stage inv_m draws a small supply current i_m, and auxiliary gain stage inv_m (when fully enable) draws a much larger supply current i_s (more than ten times as large as i_m, in this sample embodiment).

The output connections of the main and auxiliary gain stages are connected through a Schmitt trigger SCH to the oscillator output line OUT.

The output line OUT is connected, through capacitor C4, to drive the gate of NMOS transistor T6. (Resistor R2 keeps the gate of T6 low at power-up, so T6 is initially off.)

Capacitor C3 is charged by current source T7, so the voltage on C3 will initially follow the power supply voltage up. As the power supply voltage comes up (at power-on), the combined gain stage (formed by the parallel combination of inv_m and inv_s) will begin to oscillate, at a frequency largely determined by the crystal XTAL. (This happens to be 8.192 in the presently preferred embodiment.) As this oscillation builds up above the trigger level of the Schmitt trigger SCH (typically 3.5 V or so), SCH will begin to provide a square wave output which follows the analog oscillation. However, when this square wave output first goes high, a leading edge will be coupled through capacitor C4 to transiently turn on transistor T6. This will discharge capacitor C3 within a few cycles of the square wave on OUT.

When capacitor C3 is discharged, the gates of transistors T2 and T4 will follow it down (with delay determined by capacitor C2 and resistor R3).

As transistor T4 turns off, it cuts off current to PMOS transistor T3. T3 is the input to a current mirror, so this decrease in current is followed by PMOS transistor T1. T2 is turning off at the same time, so the source and sink currents to auxiliary gain stage inv_s are cut off at the same time. (This reduces the risk that he oscillator's loading might be undesirably shifted by the turned-off auxiliary gain stage.)

Note that another PMOS transistor T5 is also mirrored from T3. T5 initially provides a static pull-up current to keep capacitor C3 charged. However, when T6 begins to turn on, and the current passed by T4 is reduced as described above, the current through mirrored transistor T5 is also reduced. This reduces the load on T6, so that T6 can discharge capacitor C3 more quickly, and keep it discharged. This is a positive feedback connection, which stabilizes the switchover when inv_s is turned off.

If oscillation stops for any reason, R2 will turn off transistor T6, while current source T7 will continue to charge C3. (This is normal at power-down.) Thus (if power is still present) the gate voltage on T4 will again rise above its threshold, and the supply current to inv_s will be turned back on.

Since the turn-on and turn-off of auxiliary gain stage inv_s are gradual, this stage provides a variable level of addition drive. This is advantageous for several reasons; this configuration minimizes excess power consumption, and also helps the oscillator to recover quickly from power supply dropouts.

With appropriate choice of sizes (and with reduced positive feedback), this configuration also can be used to permit inv_s to be active in the steady state, under combined condition of high temperature, low supply, and weak transistors. This provides additional margin for proper functioning of the circuit under adverse conditions.

Figure 2B:
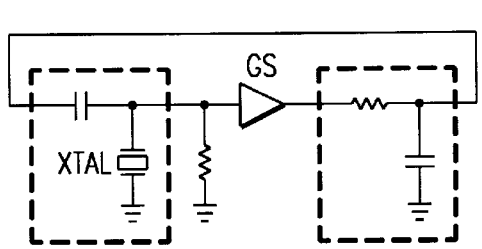
FIG. 2B shows another sample circuit implementation, using a parallel divider topology.
Figure 2C:
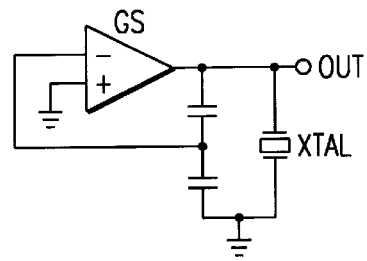
FIG. 2C shows another sample circuit implementation, using a simple Colpitts topology.
Figure 2D:
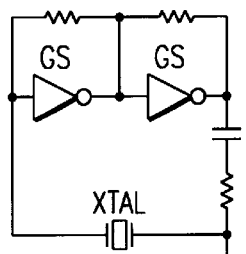
FIG. 2D shows another sample circuit implementation, using a topology with series-connected gain stages.
Figure 2A:
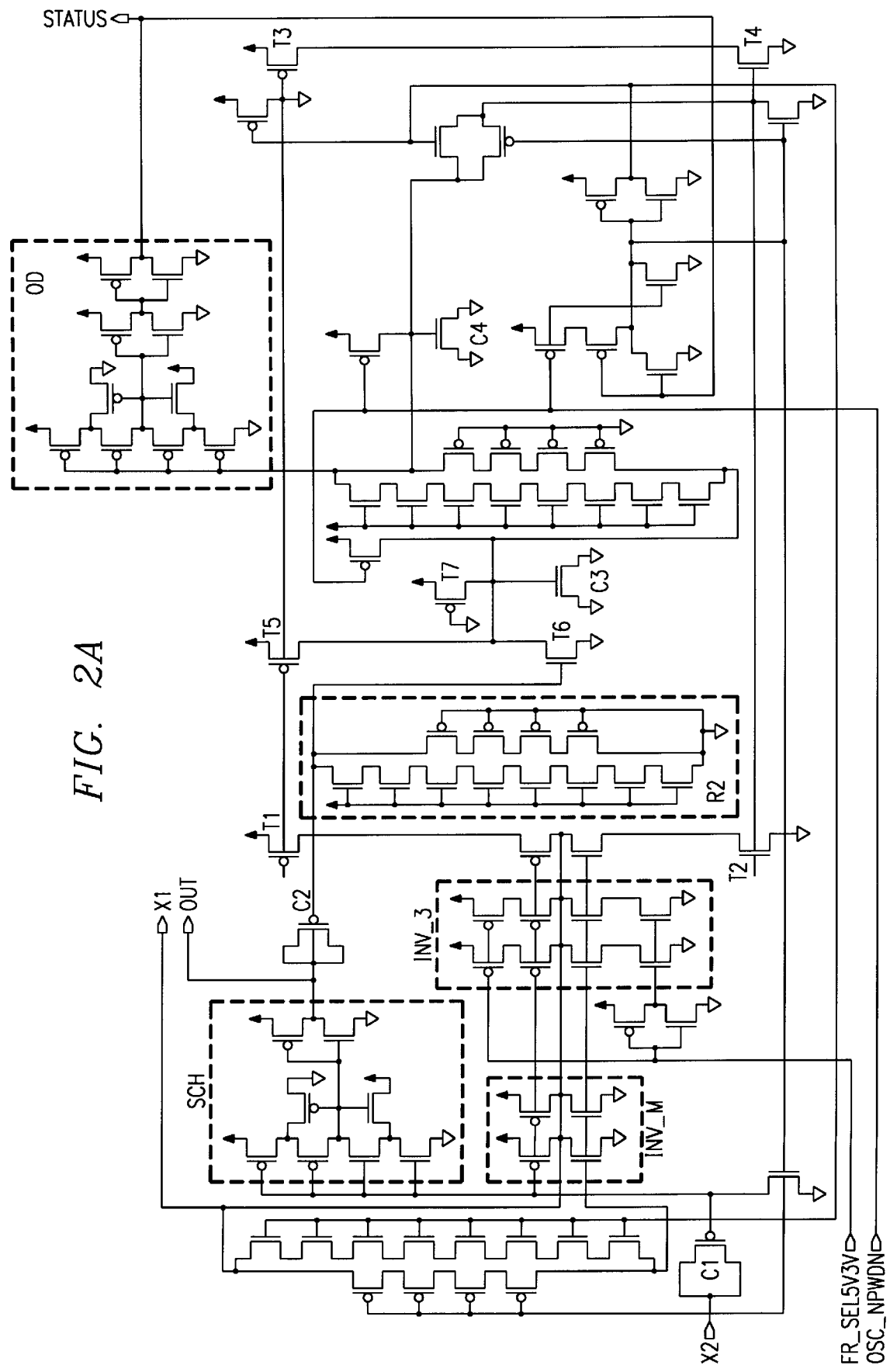
FIG. 2A shows details of a sample implementation of the circuit of FIG. 1.

FIG. 2A shows further details of a specific sample implementation of the circuit of FIG. 1. In this Figure the crystal itself is not shown, since it is off-chip; the connections to the crystal are X1 and X2.

Note also that the circuit of FIG. 2A includes a third gain stage inv_3, which is also in parallel with the main gain stage inv_m and the auxiliary gain stage inv_s. This third gain stage is turned on when an external control signal fr_sel5V3V goes low. The circuit implementation was designed to operate either with 5 V or 3 V supply, but the gain of the main and auxiliary gain stages is lower at the lower supply voltage. In this embodiment the third gain stage inv_3 is therefore turned on by this external control signal when operation at the lower supply voltage is desired.

This embodiment also includes a power-down control input osc_npwdn, which can be used to shut off power consumption.

This embodiment also shows a status output stage OD, which drives a status line STATUS. (This indicates the status of the oscillator to other circuitry.)

The output OUT is taken from the output of the Schmitt trigger SCH.

The device sizings (in arbitrary units) for the sample embodiment are as follows:

inv_m: PMOS 7/2+7/2, NMOS 2/2+2/2;
inv_s: PMOS 280/2, NMOS 90/2;
inv_3: PMOS 14/2+14/2, NMOS 4/2+4/2;
T1: 280/2;
T2: 80/2;
T3: 7/4;
T4: 2/4;
T5: 2/8;
T6: 2/8;
T7: 2/80.

The Schmitt trigger inputs include two 12/2 PMOS transistors and two 4/2 NMOS transistors, so the oscillator is not excessively loaded by this capacitance.

Alternative Circuit Embodiment: Parallel Divider Configuration

In one alternative embodiment, the feedback connection of the main stage uses a parallel divider topology instead of the topology of FIG. 1. Other details are essentially the same. FIG. 2B shows an example of this topology. To implement the present invention in this topology, the gain stage GS is implemented by a combination of a low-power main gain stage with a larger secondary gain stage which is supplied by bias currents through an analog feedback as described above.

Alternative Circuit Embodiment: Simple Colpitts Configuration

In one alternative embodiment, the feedback connection of the main gain stage uses a simple Colpitts topology instead of the topology of FIG. 1. Other details are essentially the same. FIG. 2C shows an example of the topology. To implement the present invention in this topology, the gains stage GS is implemented by a combination of a low-power main gain stage with a larger secondary gain stage which is supplied by bias currents through an analog feedback as described above.

Alternative Circuit Embodiment: Series-Connected Gain Stages

In one alternative embodiment, the feedback connection of the main gain stage used a topology with series-connected gain stages, instead of the topology of FIG. 1. Other details are essentially the same. FIG. 2D shows an example of this topology. To implement the present invention in this topology, one or both of the gain stages GS are implemented by a combination of a low-power main gain stage with a larger secondary gain stage which is supplied by bias currents through an analog feedback as described above.

Alternative Circuit Embodiment: Overtone Oscillator

The presently preferred embodiment, as described above, operates the crystal at is fundamental frequency. In one alternative embodiment, the oscillator is instead operated at a harmonic of the crystal's physical frequency of vibration. As is well known in the art of crystal oscillators, a wide variety of oscillator frequencies can be achieved by appropriate choice of the crystal and of the feedback circuit.

Sample Chip Embodiment

Figure 3:
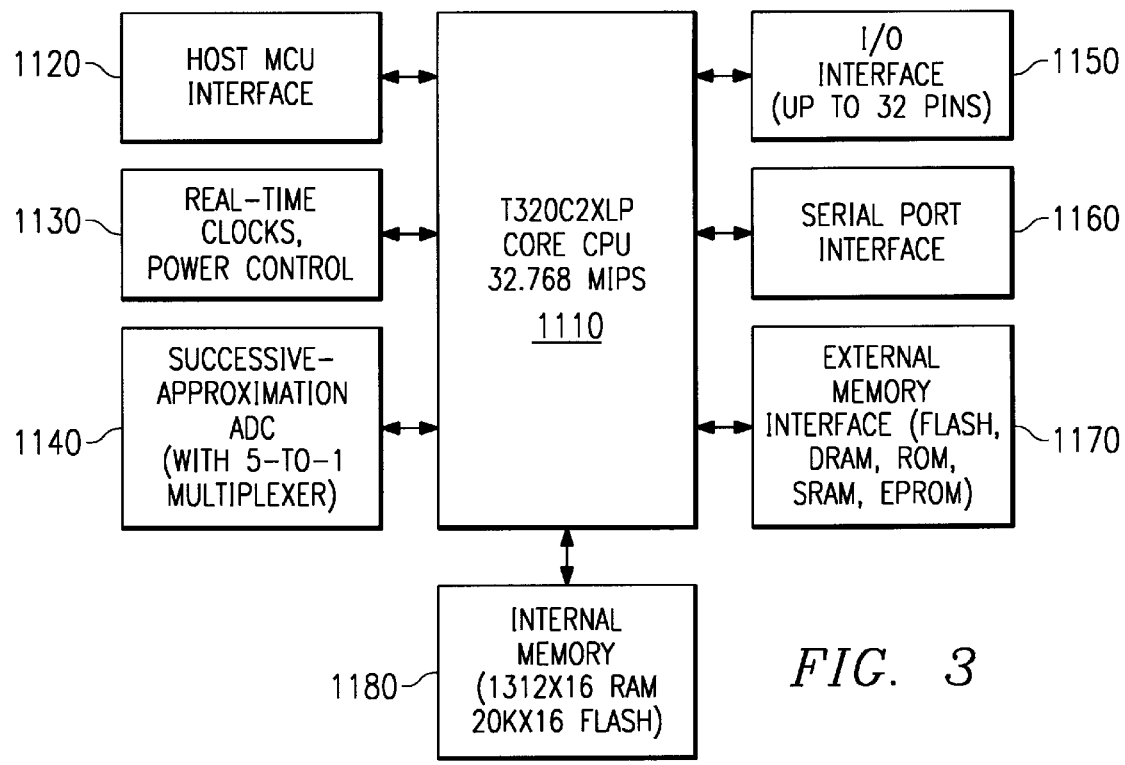
FIG. 3 shown an overview of a sample chip implementation using the circuit of FIG. 1.
Figure 4:
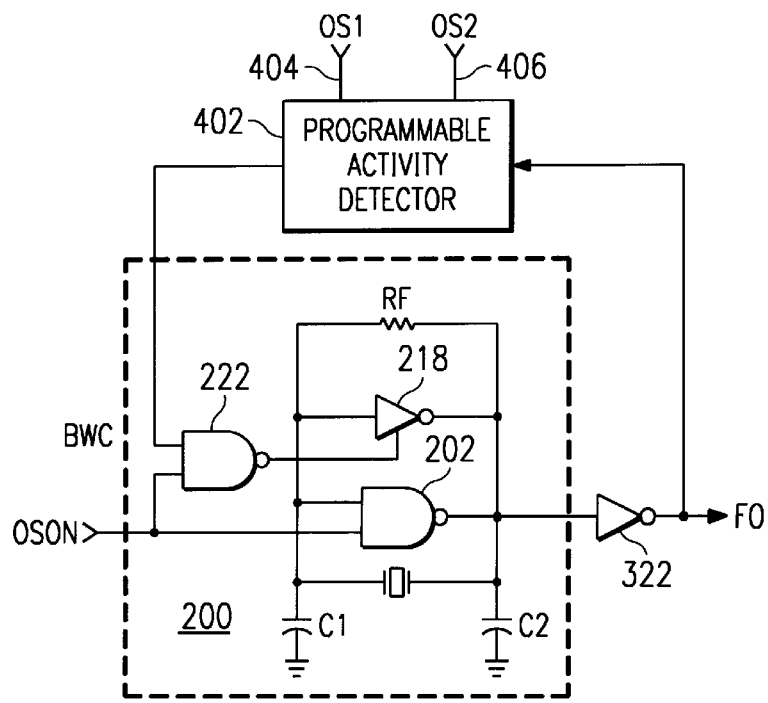
FIG. 4 shows a prior art crystal oscillator circuit with two available modes of operation.

FIG. 3 shows an overview of a sample chip implementation using the circuit of FIG. 1. This chip, in the presently preferred embodiment, is a mixed-signal processing ship which is commercially available under part number MSP58F85.

This chip has a DSP core, which performs both signal processing and control functions. To support high-speed processing, it has 20 K words of internal program flash, and 1312 words of internal RAM. It also has a flexible clock control system, which allows power consumption to be reduced during the execution of routines that do not require high-speed processing. The data sheet, user's guide, and electrical specification of the MSP58F85 is hereby incorporated by reference.

The external memory interface 1170 supports SRAM, ROM, EPROM, DRAM, flash, and memory-mapped peripherals, allowing a wide range of system configurations with no external glue logic. The I/O interface 1150 provides up to 32 general-purpose I/O pins. The host MCU interface 1120 provides an easy-to-use parallel interface to a host microprocessor, if one is needed.

The serial interface 1160 supports several analog interface chips for speech I/O. The successive-approximation ADC 1140 can be used for monitoring telephone line voltage, battery level, and other non-speech signals.

Circuit module 1130 provides real-time clocks (using the circuit of FIG. 2A) which allow day/time stamping of messages, as sell as power control circuits which permit battery backup during power failure (as well as permitting minimized power consumption under all conditions).

Other feature of the sample implementation include:

T320C2×LP Core CPU: 32.768 MIPS T320C2×LP core CPU (1110) (30.5 ns instruction cycle) at 5 Volts; Source code compatible with TMS320C25; Source code upwardly compatible with TMS320C5× family of DSPs; 64K-word data memory space; 64K-word program memory space; 1312 16-bit words of internal DARAM (1180) (RAM the supports single cycle DMOV function); Power-down (IDLE) mode; Scan-based emulation; 20K-word on-chip program flash (1180).

External Memory Interface: Additional 16M-word alternate space Internal wait state generator; Glue-less support for 8-bit and 16-bit SRAM, ROM EPROM, and flash as well as 1-bit, 4-bit and 16-bit DRAM and ARAM; Automatic conversion of external data to 16-bit internal format; Supports up to 8M-bit flash and up to 16M-bit ARAM/DRAM without glue logic; Two RAS_ lines support 2 ARAMs/DRAMs simultaneously.

General-Purpose I/O Capability: Up to 32 pins of general I/O.

Enhanced Clock Control: Phase-locked loop (PLL) generates a 32.768 MHz clock.

Power-down mode with real-time clock wake up for power consumption control; External crystal operates at 8.192 MHz.

Analog-to Digital Converter: 8-bit resolution low-frequency ADC with on-chip 5-to-1 analog multiplexer.

Host Interface: 8-bit wide and 4-wide host interface options with internal read and write latches.

Serial Interface: Interfaces to a variety of analog interface ships for speech/modem signal control.

Second frame synchronization pin permits use of two analog interface chips.

Alternative Embodiment: RF Detector

The automatically debiased double-gain-stage arrangement of FIG. 1 can also be adapted to other types of circuits. One example of this is an RF detection circuit, where the gain of the oscillator loop is reduced when a very strong signal is received. In one example of such an implementation, the crystal XTAL in FIG. 1 is replaced by a high-Q tuned circuit which is a combination antenna and tank circuit.

According to another disclosed class of innovation embodiments, there is provided: an integrated circuit crystal-stabilized oscillator, comprising: a primary gain stage, operatively connected in a feedback circuit which includes connections for an external crystal; an auxiliary gain stage, operatively connected in parallel with said primary gain stage; a capacitor, connected to receive a first current contribution which changes as the amplitude of oscillation of said auxiliary gain stage increases; and a supply current control stage, which operatively connected through a current mirror to cut off supply current to said auxiliary gain stage when said first current contribution has driven said capacitor past a voltage threshold.

According to another disclosed class of innovative embodiments, there is provided: An integrated circuit crystal-stabilized oscillator, comprising: a CMOS primary gain stage, having input and output connections operatively connected in a feedback circuit which includes connections for an external crystal; a CMOS auxiliary gain stage, having input and output connections operatively connected in parallel with said connections of said primary gain stage; a capacitor, which is operatively connected to said output connection of said primary gain stage; a first current generator which controllably provides a current determined by the voltage on said capacitor; a second current generator which provides a supply current, mirrored from said first current generator, to said auxiliary gain stage; and a positive feedback connection which accelerates turnoff of said second current generator.

According to another disclosed class of innovation embodiments, there is provided: An oscillator operation method, comprising the steps of: operating a primary gain stage in parallel with an auxiliary gain stage, with a feedback circuit which includes connections for an external crystal; integrating, on a capacitor, a first current contribution which changes as the amplitude of oscillation of said auxiliary gain stage increases; and automatically cutting off supply current to said auxiliary gain stage, using a current mirror operatively connected to be controlled by the voltage on said capacitor.

Modifications and Variations

As will be recognized by those skilled in the art, the innovative concepts described in the present application can be modifies and varied over a tremendous range of application, and accordingly the scope of patented subject matter is not limited by any of the specific exemplary teachings given, but is only defined by the issued claims.

For example, as will be apparent to those of ordinary skill in the art, other circuit elements can be added to, or substituted into, the specific circuit topologies shown.

For another example, other circuit configurations can be used to accelerate the turn-off of the auxiliary gain stage.

Additional discussion of possible variation in crystal oscillator circuit implementations is found in: Vittoz el al., "High-performance crystal oscillator circuits: theory and application," 23 *IEEE J. Solid-State Circuits* 774 (1988); Soyuer, "Design considerations for high-frequency crystal oscillators," 26*IEEE J. Solid-State Circuits* 889 (1991); R. Matthys, CRYSTAL OSCILLATOR CIRCUITS (2.ed. 1991); M. Frerking, CRYSTAL OSCILLATOR DESIGN AND TEMPERATURE COMPENSATION (1978); all of which are hereby incorporated by reference.

What is claim is:

1. An integrated circuit crystal-stabilized oscillator, comprising:

a primary gain stage, operatively connected in a feedback circuit which includes connection for an external crystal;

an auxiliary gain stage, operatively connected in parallel with said primary gain stage;

a capacitor, connected to receive a first current contribution which changes as the amplitude of oscillation of said auxiliary gain stage increases; and a supply current control stage which is operatively connected through a current mirror to cut off supply current to said auxiliary gain stage when said first current contribution has driven said capacitor past a voltage threshold.

2. The integrated circuit of claim 1, wherein said supply current control stage controls positive and negative currents supplied to said auxiliary gain stage.

3. The integrated circuit of claim 1, wherein said auxiliary gain stage draws more than ten times as much current as said primary gain stage.

4. The integrated circuit of claim 1, wherein said input connections of both said gain stages are directly connected together, and said output connections of both said gain stages are directly connected together.

5. An integrated circuit crystal-stabilized oscillator, comprising:

a CMOS primary gain stage, having input and output connections operatively connected in a feedback circuit which includes connections for an external crystal;

a CMOS auxiliary gain stage, having input and output connections operatively connected in parallel with said connections of said primary gain stage;

a capacitor, which is operatively connected to said output connection of said primary gain stage;

a first current generator which controllably provides a current determined by the voltage on said capacitor;

a second current generator which provides a supply current, mirrored from said first current generator, to said auxiliary gain stage; and a positive feedback connection which accelerates turnoff of said second current generator.

6. The integrated circuit of claim 5, wherein said positive feedback connection comprises a third current generator which provides a charging current, mirrored from said first current generator, to said capacitor.

7. The integrated circuit of claim 5, wherein said input connections of both said gain stages are directly connected together, and said output connections of both said gain stages are directly connected together.

8. The integrated circuit of claim 5, wherein said second current generator controllably supplies both positive and negative currents to said auxiliary gain stage.

9. The integrated circuit of claim 5, wherein said auxiliary gain stage draws more than ten times as much current as said primary gain stage.

10. An oscillator operation method, comprising the steps of:

operating a primary gain stage in parallel with an auxiliary gain stage, with a feedback circuit which includes connections for an external crystal;

integrating, on a capacitor, a first current contribution which changes as the amplitude of oscillation of said auxiliary gain stage increases; and automatically cutting off supply current to said auxiliary gain stage, using a current mirror operatively connected to be controlled by the voltage on said capacitor.

11. The method of claim 10, wherein said automatically cutting off step is accelerated by a positive feedback connection.

* * * * *